United States Patent
Sohn et al.

[11] Patent Number: 5,978,256
[45] Date of Patent: Nov. 2, 1999

[54] NON-VOLATILE MEMORY DEVICE USING AFM AND METHOD FOR OPERATING THE DEVICE

[75] Inventors: Hee Soo Sohn, Taejon-si; Sung Chul Hong, Yusong-ku, both of Rep. of Korea

[73] Assignee: Korea Advanced Institute of Science & Technology, Taejon-si, Rep. of Korea

[21] Appl. No.: 09/015,136

[22] Filed: Jan. 29, 1998

[30] Foreign Application Priority Data

Jul. 3, 1997 [KR] Rep. of Korea ............. 97-30776

[51] Int. Cl.[6] .................................................. G11C 13/00
[52] U.S. Cl. ...................... 365/151; 365/152; 257/315; 257/325
[58] Field of Search ................................. 365/151, 152, 365/145; 257/315–321, 325

[56] References Cited

U.S. PATENT DOCUMENTS

| | | | |
|---|---|---|---|
| Re. 31,083 | 11/1982 | DeKeersmaecker et al. | 257/325 |
| 4,217,601 | 8/1980 | DeKeersmaecker et al. | 257/325 |
| 4,939,559 | 7/1990 | DiMaria et al. | 257/315 |
| 4,945,515 | 7/1990 | Ooumi et al. | 365/151 |
| 4,962,480 | 10/1990 | Ooumi et al. | 365/151 |
| 5,132,934 | 7/1992 | Quate et al. | 365/126 |
| 5,289,402 | 2/1994 | Yamamoto et al. | 365/46 |
| 5,481,527 | 1/1996 | Kasanuki et al. | 365/145 |
| 5,608,250 | 3/1997 | Kalnitsky | 257/325 |

OTHER PUBLICATIONS

Binnig et al "Atomic Force Microscope", Physical Review Letters vol. 56, No. 9, Mar. 3, 1986, pp. 930–933.

Hudlet et al., "Electronic Forces Between Metallic Tip and Semiconductor Surfaces", J. Appl. Phys. 77(7), Apr. 1, 1985, pp. 3308–3314.

Barrett et al., "Charge Storage in a Nitride–Oxide–Silicon Medium by Scanning Capaitance Microscopy", J. Appl. Phys. 70(5), Sep. 1, 1991, pp. 2725–2733.

*Primary Examiner*—Tan T. Nguyen
*Attorney, Agent, or Firm*—Dilworth & Barrese

[57] ABSTRACT

A non-volatile memory device including a silicon oxide film formed to a desired thickness over a silicon substrate, and a plurality of nano crystals formed in the silicon oxide film by a conductive material implanted in the silicon oxide film. The invention also provides a data storing method using the non-volatile memory device. The data storing method includes the steps of disposing an atomic force microscope (AFM) tip, adapted to locally applying an electric field to a micro area, at a desired height over the semiconductor device, applying voltage of a threshold level or higher level to the AFM tip under the condition in which the height of the AFM tip is maintained, thereby effecting an electric field on a desired portion of the semiconductor device disposed beneath the AFM tip, and forcing the nano crystals formed in the silicon oxide film to capture free electrons existing in the silicon substrate by virtue of the electric field.

13 Claims, 5 Drawing Sheets

NON-VOLATILE MEMORY DEVICE USING AFM AND METHOD FOR OPERATING THE DEVICE

BACKGROUND OF THE INVENTION

1. Field of the Invention

The present invention relates to a non-volatile memory device having an $SiO_2/Si$ laminated structure, in which nano crystals are formed in the $SiO_2$ layer using an atomic force microscope (AFM) and an ion implantation process, thereby being capable of operating in the same manner as EEPROM's while having a reduced size. The present invention also relates to a non-volatile memory device including an AFM tip consisting of a thin film made of a ferroelectric material (for example, PZT-PbZrxTi-x$O_2$, SBT-SrBi$_2$Ta$_2$O$_9$, etc.) and a metal layer coated over the thin film, thereby being capable of operating in a manner similar to FRAM's while having a reduced size.

2. Description of the Prior Art

By virtue of recent rapid developments of electronic techniques, many electronic appliances have been developed and are deeply involved in modern society. It is believed that such rapid developments of electronic techniques result from developments of semiconductor techniques progressed after the development of transistors.

In order to satisfy recent demands for portable electronic appliances having a reduced size while having an increased number of functions, a variety of techniques have been proposed. In particular, the degree of integration of semiconductor memory devices has reached to a considerably high level, approaching a limit. In other words, current techniques have a limitation in how much more they are able to increase the degree of integration of semiconductor memory devices.

Semiconductor memory devices should basically perform read, write and erase operations. In accordance with current semiconductor memory fabrication techniques, each memory cell of such semiconductor memory devices basically includes a capacitor adapted to accumulate voltage of a certain level and a transistor adapted to form a charge or discharge path for the voltage accumulated in the capacitor in accordance with a control signal applied thereto. Due to such a basic memory cell configuration, there is a limitation in reducing the basic size of semiconductor memory devices using known techniques.

Accordingly, there is a problem in that it is impossible to provide semiconductor memory devices having a reduced size and an increased memory capacity as compared to those currently developed, unless a revolution of semiconductor techniques is made.

SUMMARY OF THE INVENTION

The present invention has been made in view of the above-mentioned problem, and an object of the invention is to provide a non-volatile memory device having an $SiO_2/Si$ laminated structure, in which nano crystals are formed in the $SiO_2$ layer using an atomic force microscope (AFM) and an ion implantation process, thereby being capable of operating in the same manner as EEPROM's while having a reduced size.

Another object of the invention is to provide a non-volatile memory device including an AFM tip consisting of a thin film made of a ferroelectric material (for example, PZT-PbZrxTi-x$O_2$, SBT-SrBi$_2$Ta$_2$O$_9$, etc.) and a metal layer coated over the thin film, thereby being capable of operating in a manner similar to FRAM's while having a reduced size.

In accordance with one aspect, the present invention provides a non-volatile memory device comprising: a silicon oxide film formed to a desired thickness over a silicon substrate; and a plurality of nano crystals formed in the silicon oxide film by a conductive material implanted in the silicon oxide film, the nano crystals serving to capture free electrons existing in the silicon substrate when they are subjected to an electric field having a critical intensity or more, thereby storing data.

In accordance with another aspect, the present invention provides a data storing method using a semiconductor device including a silicon oxide film formed to a desired thickness over a silicon substrate, and a plurality of nano crystals formed in the silicon oxide film by a conductive material implanted in the silicon oxide film, the nano crystals having a desired size capable of capturing electrons, the method comprising the steps of: disposing an atomic force microscope (AFM) tip, adapted to locally applying an electric field to a micro area, at a desired height over the semiconductor device; applying voltage of a threshold level or higher level to the AFM tip under the condition in which the height of the AFM tip is maintained, thereby effecting an electric field on a desired portion of the semiconductor device disposed beneath the AFM tip; and forcing the nano crystals formed in the silicon oxide film to capture free electrons existing in the silicon substrate by virtue of the electric field.

In accordance with another aspect, the present invention provides a data accessing method using a semiconductor device including a silicon oxide film formed to a desired thickness over a silicon substrate, and a plurality of nano crystals formed in the silicon oxide film by a conductive material implanted in the silicon oxide film, the nano crystals having a desired size capable of capturing electrons, the semiconductor device being stored with data in a manner that free electrons are captured in a portion of the nano crystals existing in a desired micro portion of the silicon oxide film on which an electric field is locally effected, the method comprising the steps of: (a) disposing an AFM tip, adapted to locally applying an electric field to a micro area, at a desired height over the semiconductor device; (b) applying voltage of a threshold level or lower level to the AFM tip under the condition in which the height of the AFM tip is maintained; (c) scanning an upper surface of the semiconductor device by the AFM tip under the condition in which the voltage applied to the AFM tip is maintained; and (d) detecting a variation in the height of the AFM tip from the upper surface of the semiconductor device during the scanning.

In accordance with another aspect, the present invention provides a data erasing method using a semiconductor device including a silicon oxide film formed to a desired thickness over a silicon substrate, and a plurality of nano crystals formed in the silicon oxide film by a conductive material implanted in the silicon oxide film, the nano crystals having a desired size capable of capturing electrons, the semiconductor device being stored with data in a manner that free electrons are captured in a portion of the nano crystals existing in a desired micro portion of the silicon oxide film on which an electric field is locally effected, the method comprising the step of: applying voltage of a critical level or higher level to an AFM tip having a desired area while scanning an optional portion of the semiconductor device, thereby effecting a reverse electric field on the scanned semiconductor device portion, so that free electrons captured in nano crystals existing in the scanned semiconductor device portion return to a channel formed in the silicon substrate.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
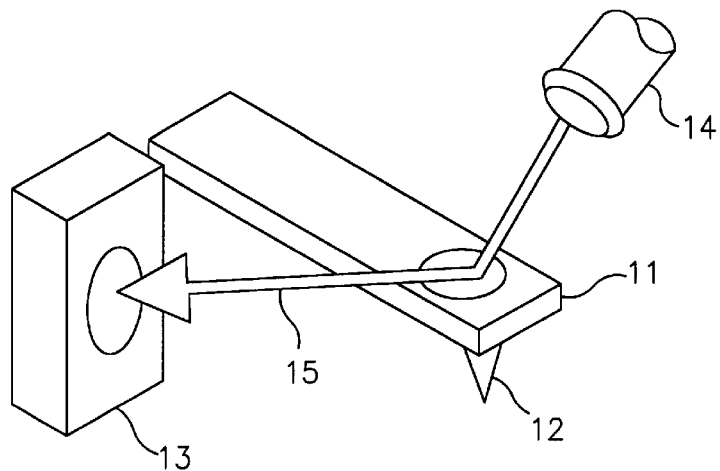
FIG. 1 is a schematic view illustrating an AFM and a sensing principle of the AFM.

First, a brief description of AFM's will be made in conjunction with FIG. 1. Although known electronic microscopes are configured to recognize figures of devices or patterns using electron beams, AFM's are configured to recognize patterns using a force existing between pure atoms, without an intermediation of electrons or atoms. Referring to FIG. 1, an AFM is illustrated which has a very fine tip 12. When the tip 12 moves along an optional surface in such a manner that it is close to the surface, a Van der Waal's force is effected between the atoms (or molecules) existing in the tip and the atoms existing in the surface. Where the tip moves along a surface having irregularities, a variation in the force effected between the atoms of the tip and surface occurs because of a variation in the distance between those atoms. The fine tip 12 is disposed on a free end of a bar 11 called a "cantilever". The cantilever 11 is vertically flexible in accordance with a physical force applied to the tip 12.

In such an AFM, accordingly, a vertical shift of the free end of the cantilever 11 from a reference position in a state, in which no force is applied to the cantilever 11, is sensed. Typically, such a vertical shift is sensed using a laser 14. A laser beam 15 emitted from the laser 14 is always focused on the free end of the cantilever 11 where the tip 12 is positioned. The laser beam 15 is reflected from the free end of the cantilever 11 so that it is incident onto a position detector 13. Based on the incident laser beam, the position detector 13 senses the vertical shift of the cantilever. As the cantilever 11 moves upwards and downwards, the initially focused position of the laser beam on the cantilever 11 varies. The position detector 13 converts such a variation in the focused position of the laser beam in the form of voltage.

Although the AFM is basically configured to pick up the image of an optional surface using only a Van der Waal's force effected between the atoms of the tip and surface, it is also possible to pick up the surface image by applying voltage or current to the tip of the AFM and sensing a variation in the applied voltage or current depending on a variation in the distance between the tip and surface.

Figure 2A:
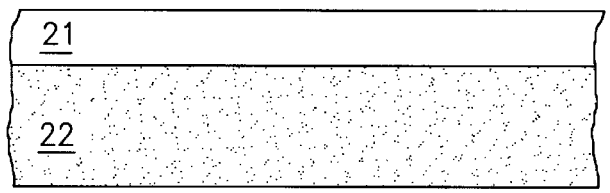
FIGS. 2a to 2c are schematic views respectively illustrating sequential steps of a procedure for forming a nano crystal structure in an $SiO_2$/Si wafer using an ion implantation process in accordance with the present invention.
Figure 2B:
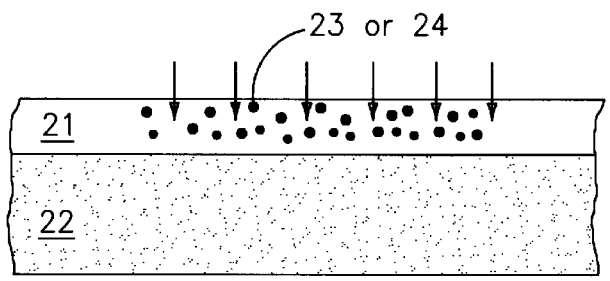
Figure 2C:
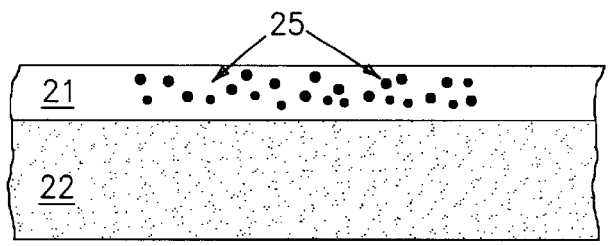

On the other hand, the ion implantation process, which is used in the present invention, is a process for implanting particular ions in a target wafer in an electrically accelerated state, thereby doping the wafer to have a desired doping depth and concentration. In accordance with the present invention, Si or Ge ions are implanted in the $SiO_2$ layer of an $SiO_2$/Si laminated structure using the ion implantation process, so as to form nano crystals in the $SiO_2$ layer. This procedure is illustrated in FIGS. 2a to 2c. This will be described in detail in conjunction with FIGS. 2a to 2c.

In accordance with the present invention, Si ions 23 or Ge ions 24 are first implanted in the $SiO_2$ layer 21 at an appropriate energy level. In FIGS. 2a to 2c, the reference numeral "22" denotes the bulk Si layer of the $SiO_2$/Si laminated structure. The energy level of the ions being implanted should be set to a level at which the implantation of those ions is stopped within the $SiO_2$ layer 21. After the implantation of ions in the $SiO_2$ layer, a heat treatment is carried out, thereby crystallizing ion-implanted portions of the $SiO_2$ layer. By virtue of this crystallization, proton points existing in the $SiO_2$ layer have a very small size. As a result, the number of electrons capable of being captured by the proton points in the $SiO_2$ layer is very small. Meanwhile, the proton points do not lose the captured electrons by virtue of a Coulomb blockcade phenomenon. The proton points formed as mentioned above serve to form a very thin $SiO_2$ tunnel. Accordingly, the resultant $SiO_2$/Si laminated structure can operate at a low operating energy level while having a reduced size as compared to known EEPROM's.

Figure 3:
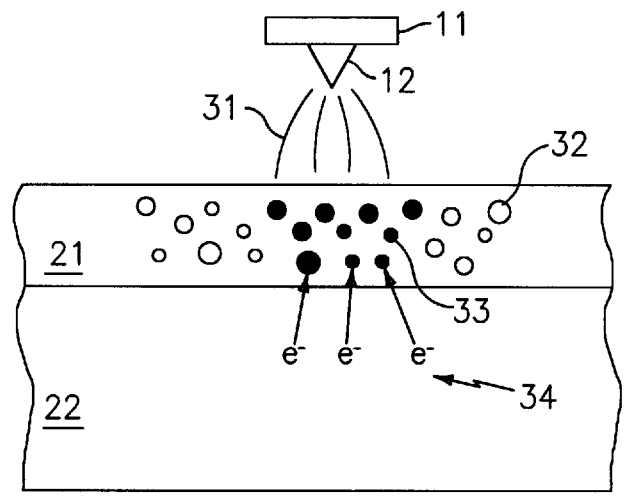
FIG. 3 is a schematic view illustrating a method for capturing electrons in proton points existing in an $SiO_2$ layer using an AFM tip in accordance with the present invention.

Now, an application of the AFM tip to the nano crystal structure formed in the $SiO_2$ layer of the $SiO_2$/Si laminated structure in accordance with the present invention will be described in conjunction with FIG. 3. In FIG. 3, the AFM tip is denoted by the reference numeral 12 whereas proton points in the nano crystal structure are denoted by the reference numerals 32 and 33. The AFM tip 12 is coated with or made of a metal in order to allow voltage to be applied thereto. When voltage of a desired level is applied between the AFM tip 12 and the sample, electrons 34 migrate from the bulk Si layer 22, so that they are captured by proton points 32 in the $SiO_2$ layer 21. In the $SiO_2$ layer 21 shown in FIG. 3, the white portions 32 correspond to empty proton points containing no electrons whereas the black portions 33 correspond to proton points in which electrons are captured.

Figure 4A:
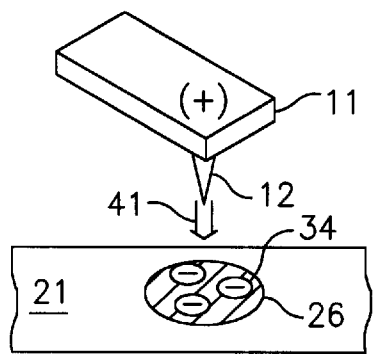
FIG. 4a is a schematic view illustrating a data reading method using an AFM in accordance with the present invention, wherein reading of data is carried out, based on a shift of an AFM tip resulting from an electric attraction force applied to the AFM tip.
Figure 4B:
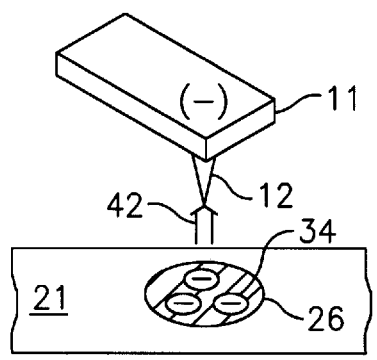
FIG. 4b is a schematic view illustrating another data reading method using an AFM in accordance with the present invention, wherein reading of data is carried out, based on a shift of an AFM tip resulting from an electric repulsion force applied to the AFM tip.

FIG. 4a illustrates a method for reading data recorded in the $SiO_2$ layer 21 using the AFM tip 12 mounted on the free end of the cantilever 11 under the condition in which a electrostatic attraction force 41 is effected between the $SiO_2$ layer 21 and the AFM tip 12. When the AFM tip 12 is in a positively charged state, it is attracted toward the surface of the $SiO_2$ layer 21, thereby downwardly bending the cantilever 11. The shifted distance of the AFM tip 12, when the AFM tip 12 is positioned over an electron-captured proton point 26 in the $SiO_2$ layer, is different from that when the AFM tip 12 is positioned over an electron-free proton point in the $SiO_2$ layer. This is because the electrostatic attraction force effecting on the AFM tip 12, when the AFM tip 12 is positioned over an electron-captured proton point 26 in the $SiO_2$ layer, is different from that when the AFM tip 12 is positioned over an electron-free proton point in the $SiO_2$ layer. Accordingly, data recorded in the $SiO_2$ layer can be read, based on a variation in the shifted distance of the AFM tip 12. On the other hand, FIG. 4b illustrates a method for reading data recorded in the $SiO_2$ layer 21 by effecting an electric repulsion force 42 between the $SiO_2$ layer 21 and the AFM tip 12, thereby upwardly bending the cantilever 11. In the case of FIG. 4b, the AFM tip 12 is upwardly shifted, different from the case of FIG. 4a.

Figure 5:
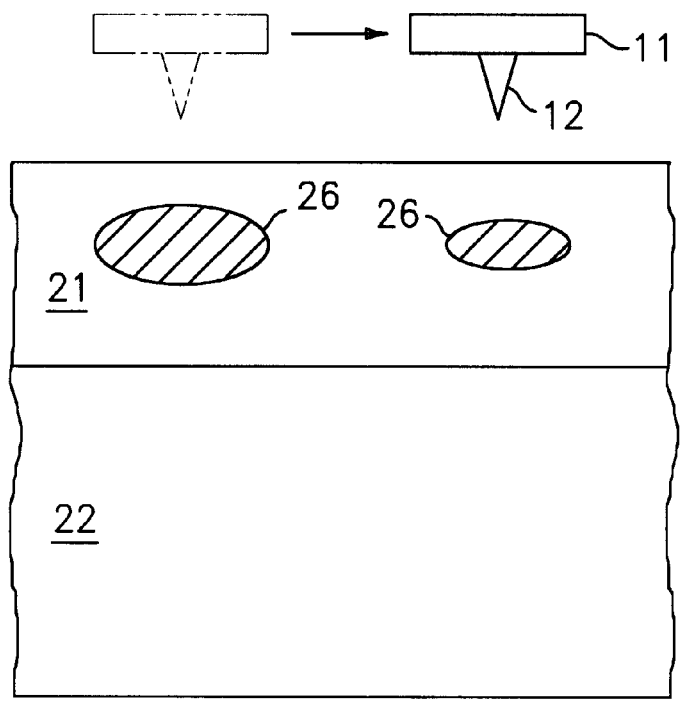
FIG. 5 is a schematic view illustrating another data reading method using an AFM in accordance with the present invention, wherein reading of data is carried out, based on a variation in capacitance depending on whether or not electrons exist.

FIG. 5 illustrates a method for reading data recorded in the $SiO_2$ layer, based on a variation in capacitance in the $SiO_2$ layer. As the AFM tip 12 moves along the surface of the $SiO_2$ layer 21, it passes electron-captured portions 26 and electron-free portions of the $SiO_2$ layer 21. Assuming that "$C_1$", "$C_2$" and "$C_3$" are the capacitance at the electron-captured portions 26, the capacitance at the electron-free portions and the capacitance at the substrate, respectively, a variation in capacitance is exhibited in the order of $C_1 \rightarrow C_2 \rightarrow C_3$ as the AFM tip 12 moves along the surface of the $SiO_2$ layer 21. Since such a variation in capacitance can be sensed by a capacitance sensor, it is possible to read data recorded in the electron-captured proton points and electron-free proton points.

Figure 6:
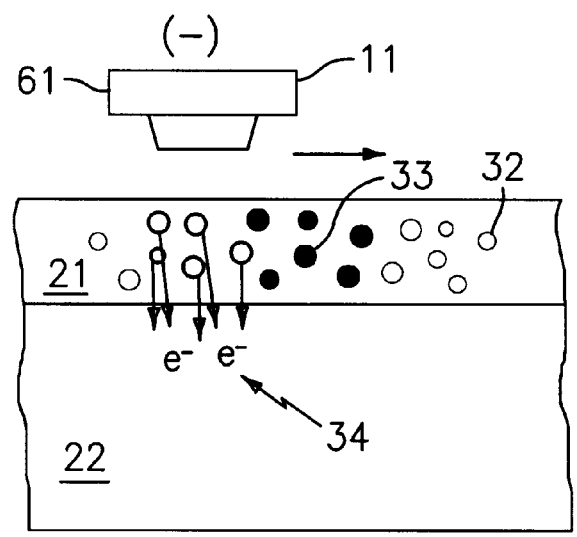
FIG. 6 is a schematic view illustrating a data erasing method using an AFM in accordance with the present invention, wherein erasing of data is carried out in a complete manner by forcing electrons captured in all proton points existing in an $SiO_2$ layer to escape from the proton points.

FIG. 6 illustrates a method for erasing data recorded in the $SiO_2$ layer by returning electrons captured in the $SiO_2$ layer to the Si layer 22. In this case, a wide tip 61 is used. When a minus voltage is applied to the wide tip 61, an electric repulsion force is generated. When the wide tip 61 moves along the surface of the $SiO_2$ layer, electrons 34 captured in proton points existing in the $SiO_2$ layer escape from the proton points and enter a channel formed in the Si layer. Where a wider tip is used, it is possible to return, to the channel, electrons captured in proton points existing in a wider portion of the $SiO_2$ layer.

Figure 7:
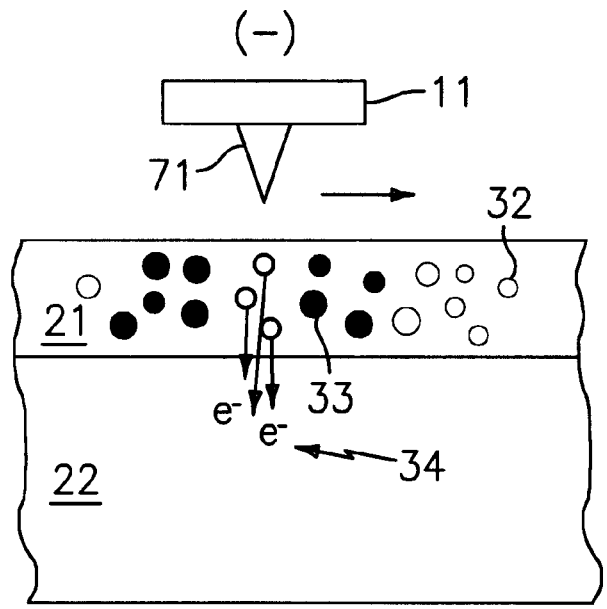
FIG. 7 is a schematic view illustrating another data erasing method using an AFM in accordance with the present invention, wherein erasing of data is carried out in a local manner by forcing electrons captured in proton points existing locally in an $SiO_2$ layer to escape from the proton points.

FIG. 7 illustrates a method for erasing data recorded in the $SiO_2$ layer in accordance with the same principle as the method of FIG. 6, except that a narrow tip 71 is used so that it effects proton points existing in a narrow portion of the $SiO_2$ layer. In this case, the tip should have a potential lower than that in the surface of the sample, as in the case of FIG. 6. That is, a minus voltage is applied to the tip. The erasing of electrons captured in proton points is carried out in the same manner as in the case of FIG. 6. In this case, however, it is possible to erase electrons captured in a reduced number of proton points because the tip used has a reduced width.

Figure 8:
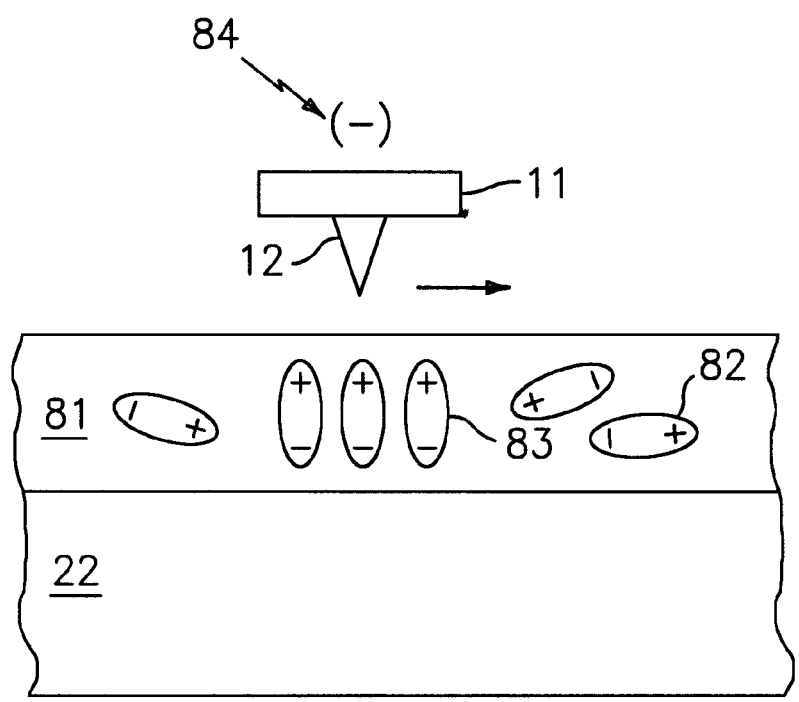
FIG. 8 is a schematic view illustrating a data storing method using an AFM in accordance with the present invention, wherein storing of data is carried out using a ferroelectric thin film in place of an $SiO_2$/Si structure while generating a local minus electric field.

FIG. 8 illustrates the case in which a ferroelectric thin film 81 formed over an Si wafer is used as a data storage medium in place of the above-mentioned $SiO_2$/Si structure. Such a ferroelectric thin film has an optionally-polarized dipole structure as compared to dielectric films. Such a dipole structure is denoted by the reference numeral 82 in FIG. 8. When an electric field is applied to the dipole structure, dipoles optionally polarized change their polarization direction in accordance with the direction of the applied electric field. The changed polarization direction of the dipoles is maintained even after the electric field or voltage is removed. This state is a state in which particular data is stored. FIG. 8 shows the condition in which dipoles existing in the ferroelectric thin film 81 are polarized when a minus electric field 84 is applied to the AFM tip 12 of the cantilever 11. Erasing of data stored as mentioned above can be carried out in the same manner as in the case of FIG. 6 or 7. Also, reading of the data can be carried out in the above-mentioned manner.

Figure 9:
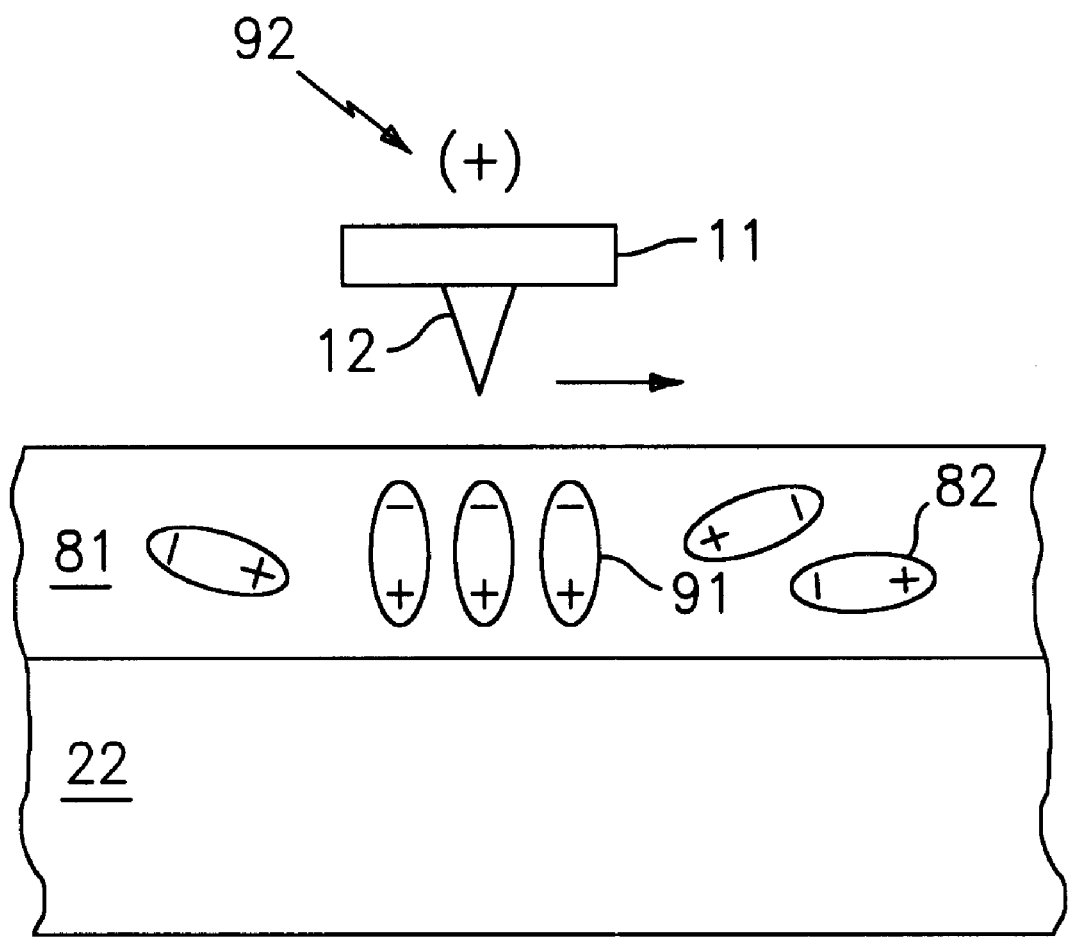
FIG. 9 is a schematic view illustrating another data storing method using an AFM in accordance with the present invention, wherein storing of data is carried out using a ferroelectric thin film in place of an $SiO_2$/Si structure while generating a local plus electric field.

FIG. 9 illustrates a data recording method in which a plus electric field 92 is applied to the AFM tip 12 of the cantilever 11. This method is the same as that of FIG. 8, except that the polarization direction of dipoles is opposite to that in the case of FIG. 8. It can be understood that, in this case, data different from that recorded in the case of FIG. 8 may be recorded in the same manner as in the case of FIG. 8.

As apparent from the above description, the present invention provides a method for fabricating a non-volatile memory device using an AFM and a method for operating such a non-volatile memory device, which are capable of achieving a storage of an increased amount of data in a reduced memory area.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A non-volatile memory device comprising:
    a silicon oxide film formed to a desired thickness over a silicon substrate; and
    a plurality of nano crystals formed in the silicon oxide film by a conductive material implanted in the silicon oxide film, the nano crystals serving to capture free electrons existing in the silicon substrate when they are subjected to an electric field having a critical intensity or more, thereby storing data,
    wherein the conductive material is Ge ions.

2. A data storing method using a semiconductor device including a silicon oxide film formed to a desired thickness over a silicon substrate, and a plurality of nano crystals formed in the silicon oxide film by a conductive material implanted in the silicon oxide film, the nano crystals having a desired size capable of capturing free electrons existing in the silicon substrate when they are subjected to an electric field having a critical intensity or more, thereby storing data, the method comprising the steps of:
    disposing an atomic force microscope (AFM) tip, adapted to locally applying an electric field to a micro area, at a desired height over the semiconductor device;
    applying voltage of a threshold level or higher level to the AFM tip under the condition in which the height of the AFM tip is maintained, thereby effecting an electric field on a desired portion of the semiconductor device disposed beneath the AFM tip; and forcing the nano crystals formed in the silicon oxide film to capture free electrons existing in the silicone substrate by virtue of the electric field.

3. The data storing method in accordance with claim 2, wherein the AFM tip has a surface made of a metal.

4. A data accessing method using a semiconductor device including a silicon oxide film formed to a desired thickness over a desired over a silicon substrate, and a plurality of nano crystals formed in the silicon oxide film by a conductive material implanted in the silicon oxide film, the nano crystals having a desired size capable of capturing free electrons existing in the silicon substrate when they are subjected to an electric field having a critical intensity or more, thereby storing data, the semiconductor device being stored with data in a manner that free electrons are captured in a portion of the nano crystals existing in a desired micro portion of the silicon oxide film on which an electric field is locally effected, the method comprising the steps of:

(a) disposing an AFM tip, adapted locally applying an electric field to a micro area, at a desired height over the semiconductor device;

(b) applying voltage of a threshold level or lower level to the AFM tip under the condition in which the height of the AFM tip is maintained;

(c) scanning an upper surface of the semiconductor device by the AFM tip under the condition in which the voltage applied to the AFM tip is maintained; and (d) detecting a variation in the height for the AFM tip from the upper surface of the semiconductor device during the scanning.

5. The data accessing method in accordance with claim 4, wherein the logic value of the stored data is recognized at the step (d), based on the detected variation in the height of the AFM tip, while taking into consideration the characteristic of the voltage applied to the AFM tip at the step (b).

6. The data accessing method in accordance with claim 5, wherein the stored data is recognized to have a logic value of "1" at the step (d) when a repulsion force is generated by electron-captured nano crystals associated with the data under the condition in which the voltage applied to the AFM tip at the step (b) is minus.

7. The data accessing method in accordance with claim 5, wherein the stored data is recognized to have a logic value of "1" at the step (d) when an attraction force is generated by electron-captured nano crystals associated with the data under the condition in which the voltage applied to the AFM tip at the step (b) is plus.

8. The data accessing method in accordance with claim 4, wherein the stored data is recognized to have a logic value of "1" at the step (d) when a repulsion force is generated by electron-captured nano crystals associated with the data under the condition in which the voltage applied to the AFM tip at the step (b) is minus.

9. The data accessing method in accordance with claim 4, wherein the stored data is recognized to have a logic value of "1" at the step (d) when an attraction force is generated by electron-captured nano crystals associated with the data under the condition in which the voltage applied to the AFM tip at the step (b) is plus.

10. A data accessing method using a semiconductor device including a silicon oxide film formed to a desired thickness over a silicon substrate, and a plurality of nano crystals formed in the silicon oxide film by a conductive material implanted in the silicon oxide film, the nano crystals having a desired size capable of capturing free electrons existing in the silicon substrate when they are subjected to an electric field having a critical intensity or more, thereby storing data, the semiconductor device being stored with data in a manner that free electrons are captured in a portion of the nano crystals existing in a desired micro portion of the silicon oxide film on which an electric field is locally effected, the method comprising the steps of:

(a) disposing an AFM tip at a desired height over the semiconductor device, and scanning an upper surface of the semiconductor device by the AFM tip under the condition in which the height of the AFM tip is maintained; and (b) detecting a variation in capacitance between electron-captured and electron-free portions of the semiconductor device during the scanning, thereby determining a storage of data in the semiconductor device.

11. The data accessing method in accordance with claim 10, wherein the detection of the variation in capacitance at the step (b) is carried out using a capacitance sensor.

12. A data erasing method using a semiconductor device including a silicon oxide film formed to a desired thickness over a silicon substrate, and a plurality of nano crystals formed in the silicon oxide film by conductive material implanted in the silicon oxide film, the nano crystals having a desired size capable of capturing free electrons existing in the silicon substrate when they are subjected to an electric field having a critical intensity or more, thereby storing data, the semiconductor device being stored with data in a manner that free electrons are captured in a portion of the nano crystals existing in a desired micro portion of the silicon oxide film on which the electric field is locally effected, the method comprising the step of:

applying voltage of a critical level or higher level to an AFM tip having a desired area while scanning an optional portion of the semiconductor device, thereby effecting a reverse electric field on the scanned semiconductor device portion, so that the free electrons captured in nano crystals existing the scanned semiconductor device portion return to a channel formed in the silicon substrate.

13. A non-volatile memory device comprising:

a ferroelectric film formed to a desired thickness over a silicon substrate, the ferroelectric film having an optionally-polarized dipole structure so that when the ferroelectric film is subjected at a portion thereof to an electric field having a critical intensity or more and exhibiting a first polarity, dipoles existing in the ferroelectric film portion are aligned together, thereby causing the ferroelectric film portion exhibits a second polarity at an upper surface thereof.

* * * * *